United States Patent
Yu et al.

(10) Patent No.: US 9,476,903 B2
(45) Date of Patent: Oct. 25, 2016

(54) ACCELEROMETER AND ITS FABRICATION TECHNIQUE

(71) Applicant: Chinese Academy of Sciences Institute of Geology and Geophysics, Beijing (CN)

(72) Inventors: Du Li Yu, Beijing (CN); Lian Zhong Yu, Beijing (CN); Chang Chun Yang, Beijing (CN)

(73) Assignee: Chinese Academy of Sciences Institute of Geology and Geophysics, Beijing (CN)

( * ) Notice: Subject to any disclaimer, the term of this patent is extended or adjusted under 35 U.S.C. 154(b) by 402 days.

(21) Appl. No.: 14/031,682

(22) Filed: Sep. 19, 2013

(65) Prior Publication Data

US 2014/0069191 A1    Mar. 13, 2014

(30) Foreign Application Priority Data

Sep. 21, 2012  (CN) .......................... 2012 1 0356542

(51) Int. Cl.
G01P 15/125 (2006.01)
G01P 15/02 (2013.01)
(Continued)

(52) U.S. Cl.
CPC ........... *G01P 15/02* (2013.01); *B81C 1/00269* (2013.01); *G01P 15/0802* (2013.01); *G01P 15/125* (2013.01); *B81B 2201/0235* (2013.01); *B81C 2203/0118* (2013.01)

(58) Field of Classification Search
CPC ..................... G01P 2015/0837; G01P 15/125
USPC .......................................... 73/514.32, 514.38
See application file for complete search history.

(56) References Cited

U.S. PATENT DOCUMENTS

| 6,450,033 B1 * | 9/2002 | Ito .......................... B81B 3/0051 |
| | | 73/514.29 |
| 6,805,008 B2 | 10/2004 | Selvakumar et al. |
| 7,428,841 B2 | 9/2008 | Harada et al. |

FOREIGN PATENT DOCUMENTS

| CN | 1844932 A | 10/2006 | |
| CN | 101013637 A * | 8/2007 | ............. H01H 35/14 |

(Continued)

OTHER PUBLICATIONS

Zhou et al., "A Single Axis Area Changeable Capacitive Accelerometer with Folded Springs," 2008, IEEE, pp. 128-131.*

(Continued)

*Primary Examiner* — John Chapman, Jr.
(74) *Attorney, Agent, or Firm* — Dergosits & Noah LLP

(57) ABSTRACT

An accelerometer, comprises, a measurement mass, a top cap silicon wafer and a bottom cap silicon wafer, which both are coupled with the said measurement mass; the measurement mass comprises a support frame, a mass, and a plurality of resilient beams; the mass and the resilient beams are located within the support frame; the mass and the support frame are connected by several sets of the resilient beams, and each set comprises two resilient folding beams; the resilient folding beams are symmetrically provided with respect to the midline of the mass; a connection beam is provided in between each set of the resilient folding beams to connect the resilient folding beams together. Silicon wafers with electrodes are bonded on the top and bottom surfaces of the measurement mass; and forms a capacitor with the measurement mass. The accelerometer in the present invention has a large mode isolation ratio, and it is symmetrical in high order vibrational modes, which further decreases the noise of the MEMS chip. Therefore, the accelerometer has the advantages of high measurement accuracy, high stability, and low noise.

10 Claims, 6 Drawing Sheets

(51) Int. Cl.
    *G01P 15/08*     (2006.01)
    *B81C 1/00*     (2006.01)

(56) References Cited

FOREIGN PATENT DOCUMENTS

| CN | 101858929 A | 10/2010 |
|---|---|---|
| CN | 202815008 U | 3/2013 |
| JP | 2001-4658 A | 1/2001 |
| JP | 2010-210431 A | 9/2010 |

OTHER PUBLICATIONS

International Search Report for Application No. PCT/CN2013/000829 Dated Oct. 10, 2013.
Written Opinion for Application No. PCT/CN2013/000829 Dated Oct. 10, 2013.

* cited by examiner

ACCELEROMETER AND ITS FABRICATION TECHNIQUE

CROSS-REFERENCE

This application claims priority from Chinese Patent Application No. 201210356542.3, filed Sep. 21, 2012 and entitled An Accelerometer and its Fabrication Technique, which is incorporated by reference in its entirety.

TECHNICAL FIELD

This invention relates to a sensor, particularly to an accelerometer.

BACKGROUND

Nowadays, accelerometers have been used in various applications, such as, measuring the magnitude of earthquake and gathering seismic data, detecting the magnitude of collision during a car collision, and detecting the tilting direction and angle of a mobile phone or a game console. As the micro-electro-mechanical systems (MEMS) technology continues to progress, many nano-scale accelerometers have been widely commercially used.

There are two kinds of accelerometers which are commonly used: piezoresistive accelerometers and capacitive accelerometers. Piezoresistive accelerometer, such as Chinese invention patent application with Publication No. CN1748146 and Publication Date of Mar. 15 2006, usually comprises mass and beams, piezo elements are provided on the beam. The mass moves according to the acceleration, and causes the beam to deform, which also causes the change of resistance. However, under situations when there is no acceleration or the acceleration magnitude is relatively small, the beam will not deform significantly. And there is no significant change in resistance. The accelerometer can only detect acceleration when the magnitude of acceleration is large enough to cause the deformation of the beam. Therefore, such accelerometer has low accuracy.

Capacitive accelerator, such as U.S. Pat. No. 6,805,008, with Publication Date of Oct. 19, 2004, also includes beam and mass. When the acceleration is present, the frame of the accelerometer will move according to the acceleration direction, but due to inertia, there is little displacement for the mass. Thus, the gap distance change between the mass and another electrode causes a change in capacitance. Both kinds of accelerometers are manufactured by micro fabrication technique and have the characteristics of small size and low manufacturing cost. However, the beams are resilient beams, and there are only four beams connecting the mass with the frame. Thus, when the outer frame moves, the displacement of each beam is relatively large. Also, each beam will not create a uniform displacement and deformation, which leads to unsymmetrical vibrational modes.

SUMMARY

The present invention is intended to overcome the shortages of the existing accelerometers, and to provide an accelerometer with relatively high stability and reliability.

In accordance with the present invention to provide an accelerometer, comprising a measurement mass, a top cap silicon wafer and a bottom cap silicon wafer, which both are coupled with the said measurement mass; the measurement mass comprises a support frame, a mass, and a plurality of resilient beams; the mass and the resilient beams are located within the support frame; the mass and the support frame are connected by several sets of the resilient beams, and each set comprises two resilient folding beams; the resilient folding beams are symmetrically provided with respect to the midline of the mass; a connection beam is provided between each set of the resilient folding beams to connect the resilient folding beams together.

The present invention also has the following features:

The connection beams are resilient connection beams.

The two ends of the resilient folding beams are located along the same line.

One end of the resilient folding beam is respectively connected to the corner of the mass.

The measurement mass has a double side silicon on insulator (SOI) structure, which includes top silicon layer, middle silicon layer, and bottom silicon layer; a silicon dioxide layer is provided between every two silicon layers. The double side silicon on insulator structure is also referred as double side SOI structure.

A plurality of the resilient beams is respectively symmetrically formed in the top silicon layer and the bottom silicon layer to compose a double layer structure.

Electrodes are respectively provided on the measurement mass, the top cap silicon wafer and the bottom cap silicon wafer.

In accordance with the present invention to provide a fabrication technique for the accelerometer, including the following steps:

Step 1, use photolithography, deep etching and etching to form a plurality of holes penetrating from the top silicon layer and bottom silicon layer to the middle silicon layer of the double side SOI silicon wafer;

Step 2, deposit polycrystalline silicon in the holes to fill up the holes in order to form an electric circuit; then grow a silicon dioxide layer on the surfaces of the top silicon layer and bottom silicon layer of the double side SOI silicon wafer, and polish the surface;

Step 3, use photolithography, deep etching and etching to form several sets of symmetrical resilient folding beams on the double side SOI silicon wafer; then use thermal oxidation to grow silicon dioxide on the exposed surfaces of the resilient folding beams, or use chemical vapor deposition (CVD) method to dispose a layer of silicon dioxide on the exposed surfaces of the resilient folding beams;

Step 4, use lithography and etching to remove the exposed silicon dioxide in the middle silicon layer, and deep etch the middle silicon layer to a certain depth;

Step 5, simultaneously perform corrosion in the horizontal and vertical directions to the middle silicon layer located between the frame and the mass in order to form free-moving resilient beams and connection beams;

Step 6, corrode the exposed silicon dioxide layer;

Step 7, perform an one-step bonding to the top cap silicon wafer, the processed double side SOI silicon wafer, and the bottom cap silicon wafer.

According to the present invention, the fabrication technique for the accelerometer further includes the following steps:

The fabrication technique for the top cap silicon wafer and bottom cap silicon wafer further comprises:

A. use photolithography, deep etching and etching to form a through hole on the top cap silicon wafer or the bottom cap silicon wafer;

B. use photolithography, deep etching and etching to respectively form a recess area on each bonding surface of the top cap silicon wafer and bottom cap silicon wafer;

C. clean the top cap wafer and bottom cap wafer before bonding with the double side SOI silicon wafer;

D. after bonding with the double side SOI silicon wafer, deposit metal on the surfaces of top cap silicon wafer and bottom cap silicon wafer to form electrodes; and deposit metal on the surface of double side SOI silicon wafer through the through hole formed on the top cap silicon wafer or bottom cap silicon wafer to form an electrode from the through hole.

In the fabrication technique disclosed in the present invention, the silicon dioxide layers serve the purpose of protecting the silicon layers, which are covered up by the silicon dioxide layers, from etching or corrosion.

The said depth etching and etching method includes one or more from the following methods: dry etching or wet etching; the said dry etching comprises: silicon deep reactive-ion etching and reactive-ion etching.

The etchant for etching the silicon layer comprises one kind or a combination of the following etchants: potassium hydroxide, tetramethylammonium hydroxide, ethylenediamine pyrocatechol or gaseous xenon difluoride.

The etchant for etching the silicon dioxide layer comprises one kind or a combination of the following etchants: buffered hydrofluoric acid, 49% hydrofluoric acid or gaseous hydrogen fluoride. The said silicon dioxide layer can also be removed by reactive-ion etching of the dry etching method.

In accordance to the present invention, the accelerometer and its fabrication technique has the following advantages. First of all, the arrangement of two layers of symmetrical resilient folding beams between the mass and the support frame makes the overall structure more symmetrical and stable. The magnitude of displacement of each set of resilient beam is relatively small under condition of acceleration. Furthermore, by adding a connection beam between two resilient folding beams, the invention further limits the magnitude of displacement of each set of resilient beam. Thus it makes the accelerometer's vibrational modes completely symmetrical with respect to the center of the mass; and the accelerometer is able to detect the slightest acceleration. Also, the present invention has a large mode isolation ratio, and the mass is symmetrical in high order vibrational modes; the resonance frequency of the resilient beam is much higher than the baseband frequency, which further decreases the noise of the MEMS chip. Therefore, the accelerometer has the advantages of high measurement accuracy, high stability, and low noise.

The fabrication technique disclosed in the present invention uses double side SOI silicon wafer and one-step bonding technique for three pieces of silicon wafer; by etching the resilient beams and the mass on the double side SOI silicon wafer, the components can be accurately aligned and forms a highly symmetrical structure. Compared with the prior art, which uses bonding technique to fabricate the dual-layer beams, the accelerometer fabricated by the present technique has high accuracy and small error; the throughput yield is also significantly increased. Since the etching technique is relatively simple, the present fabrication technique also has a high productive efficiency and low manufacturing cost.

DETAILED DESCRIPTION

The present invention will be described in further detail below with reference to the drawings and specific embodiments.

Figure 1:
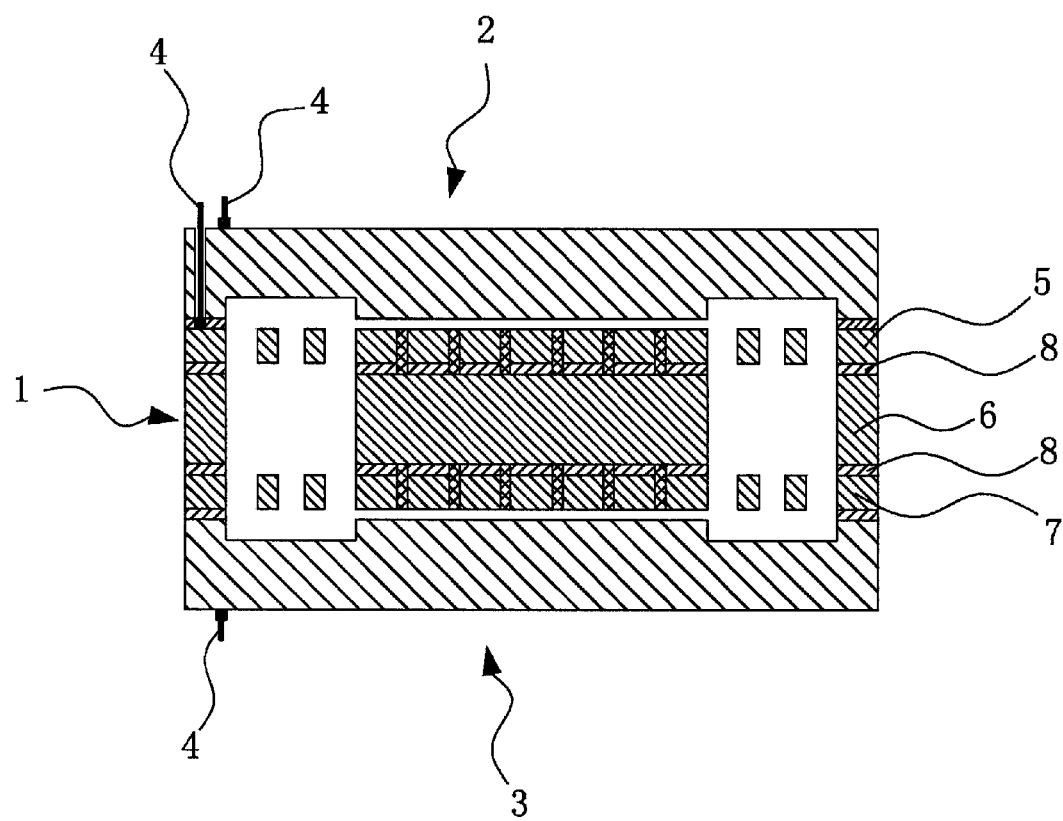
FIG. 1 is a structure scheme of the present invention.

With reference to FIG. 1, an accelerometer comprises: measurement mass 1, top cap silicon wafer 2 and bottom cap silicon wafer 3, which both are coupled with the measurement mass 1; electrodes 4 are respectively provided on the measurement mass 1, the top cap silicon wafer 2, and the bottom cap silicon wafer 3. The measurement mass 1 has a double side SOI structure, it comprises top silicon layer 5, middle silicon layer 6, and bottom silicon layer 7; silicon dioxide layers 8 are provided between every two silicon layers. A plurality of resilient beams 12 are respectively formed in the top silicon layer 5 and the bottom silicon layer 7.

Figure 2:
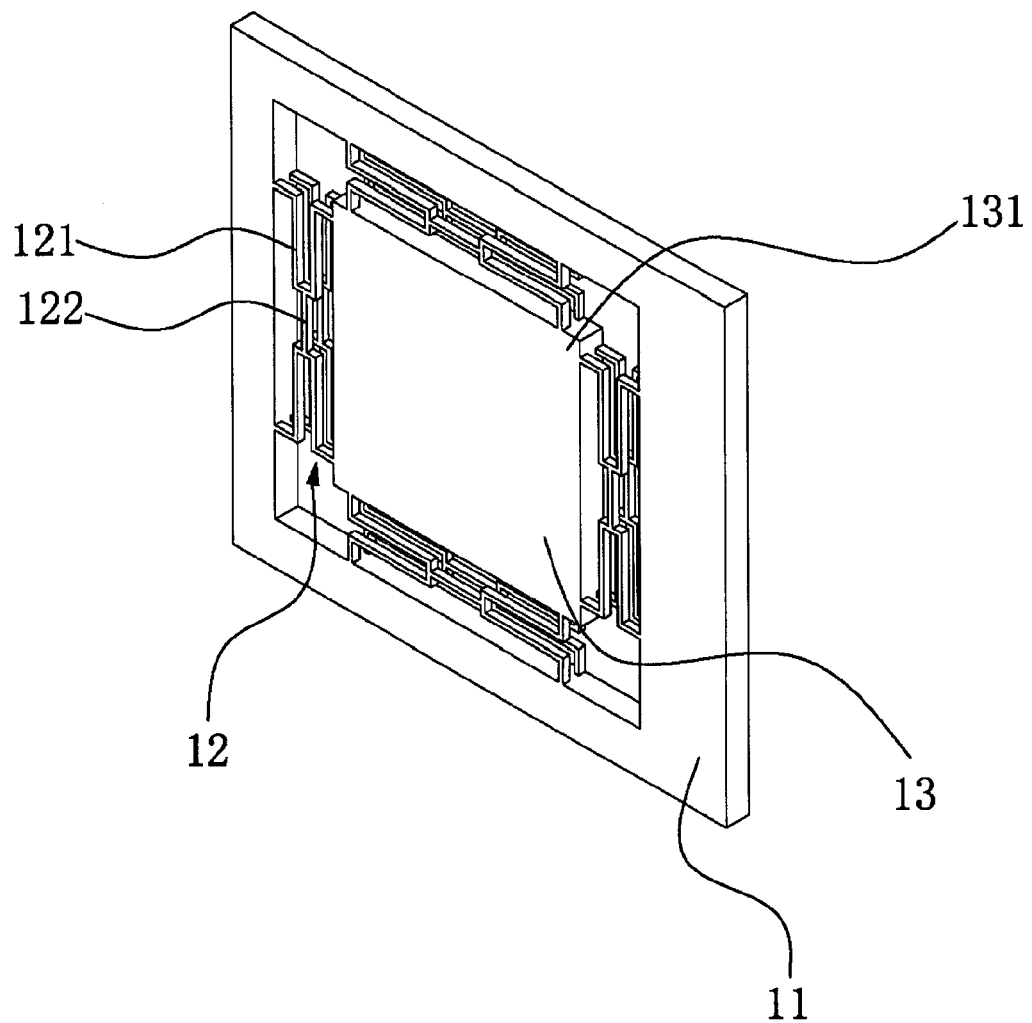
FIG. 2 is a perspective view of the measurement mass in the present invention.
Figure 3:
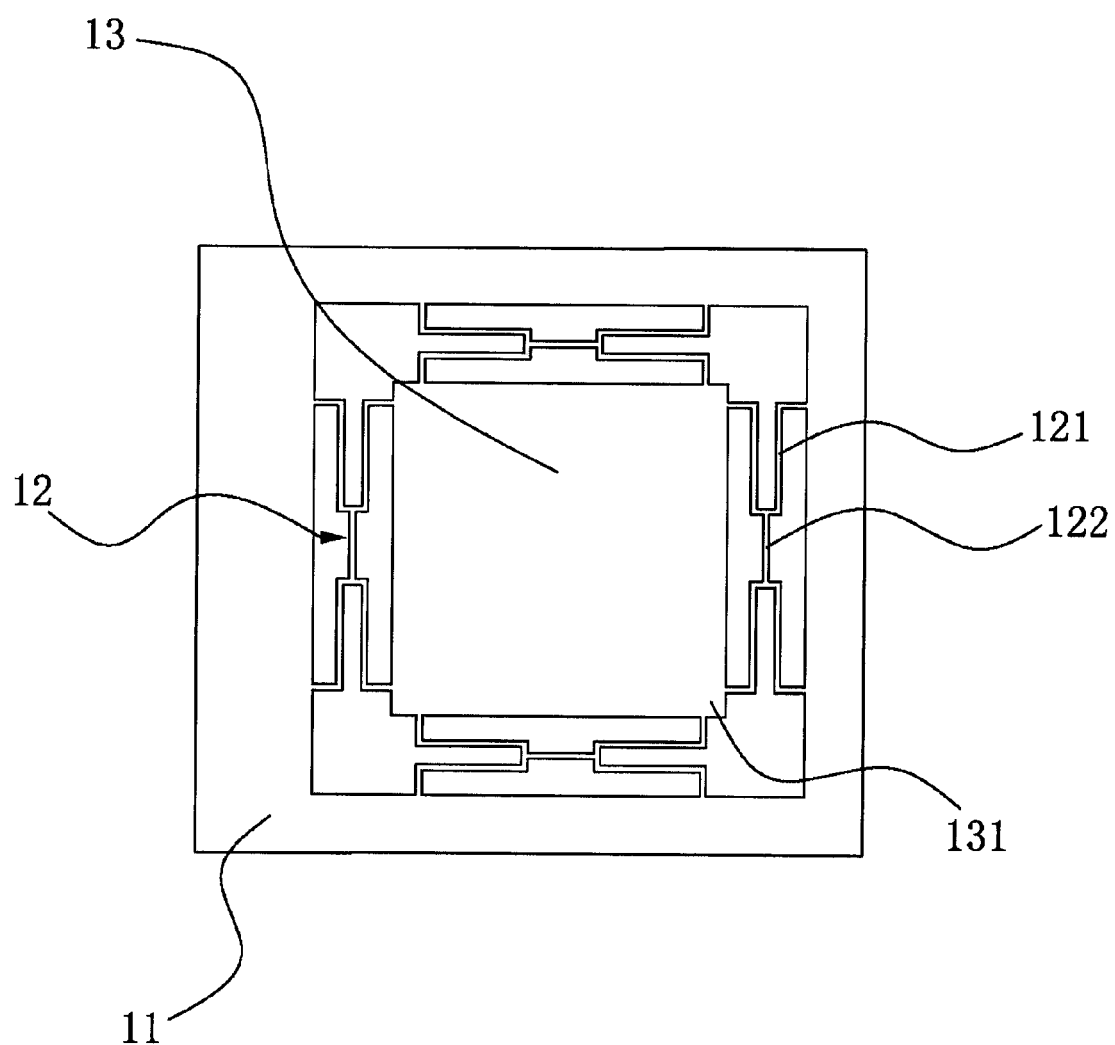
FIG. 3 is a top view of the measurement mass in the present invention.

With reference to FIGS. 2 and 3, the measurement mass 1 comprises support frame 11, a plurality of resilient beams 12, and a mass 13. The resilient beams 12 and the mass 13 are located within the support frame 11; the mass 13 is coupled with the support frame 11 by multiple sets of resilient beams 13; each set of resilient beam 12 includes two resilient folding beams 121, which are symmetrically provided with respect to the midline of the mass 13. Each set of resilient folding beams 121 are connected by a connection beam 122. The connection beam 122 is a resilient connection beam. The two ends of resilient folding beams are located along the same line.

With reference to FIGS. 2 and 3, preferably, the mass 13 is a rectangular body, and its cross section is a square. Multiple sets of resilient beams 12 are located in the top silicon layer 5 and bottom silicon layer 7. Preferably, four sets of resilient beams 12 are symmetrically provided in each silicon layer. Each set of resilient beam 12 includes two resilient folding beams 121. One end of each resilient folding beam 121 is connected to the corner 131 of the mass 13; thus it keeps the mass 13 at a horizontal position when there is no acceleration. When the acceleration is detected, the resilient folding beams 121, which are provided at the corners 131, will limit the area of movement of the mass 13, and prevent from reading over-limit or error data. The shape of the mass 13 in the present invention however is not limited to a rectangular shape; it can also be other shapes, such as hexagon, octagon, circle, etc. The arrangement of resilient beams 12 is also not limited to a two layer structure, where each layer contains four groups of resilient beams 12; it can also be a structure containing multiple layers and multiple groups.

With reference to FIGS. 1 and 3, the measurement mass 1 has a double side SOI structure, it comprises top silicon layer 5, middle silicon layer 6, and bottom silicon layer 7; silicon dioxide layers 8 are provided between every two silicon layers. Multiple resilient beams 12 are respectively formed in the top silicon layer 5 and the bottom silicon layer 7. Electrodes 4 are provided on the measurement mass 1, the top cap silicon wafer 2, and the bottom cap silicon wafer 3. A capacitor is formed between the measurement mass 1, the top cap silicon wafer 2, and the bottom cap silicon wafer once the electric circuit is closed. When there is no acceleration, the capacitance between the measurement mass 1, the top cap silicon wafer 2, and the bottom cap silicon wafer is constant. When the acceleration is detected, the support frame 11 will displace towards the acceleration direction. Meanwhile, the resilient beams 12 will also have a certain amount of displacement. However, due to inertia, the magnitude of displacement of the mass 13 is relatively small. According to equation $C=\epsilon A/d$, where the capacitance between two parallel conductive plates equals to the permittivity of material ($\epsilon$) times area (A) divide by the separation distance (d). When displacement is generated due to acceleration, the distance between the mass 13, the top cap silicon wafer 2 and bottom cap silicon wafer 3 changes. Therefore, the capacitance between the measurement mass 1, the top cap silicon wafer 2 and the bottom cap silicon wafer 3 also changes. The integrated circuit can calculate the measured acceleration based on the change of capacitance. After the acceleration disappears, the resilient beams 12 will return to its original state, which returns the capacitance between the mass 13, the top cap silicon wafer 2 and the bottom cap silicon wafer 3 to a constant value.

By providing two layers of resilient beams 12, which are symmetrical along the midline of the mass 13, in between the mass 13 and the support frame 11, the invention effectively reduces the magnitude of displacement of each resilient folding beam 121. It also unifies magnitude of displacement of each resilient folding beam 121. By adding the connection beam 122 between the resilient folding beams 121, the invention further unifies the magnitude of displacement of each resilient folding beam 121. Thus it decreases the possibility of reading over-limit or error data due to the over-limit displacement of the resilient beams 12. Furthermore, since the magnitude of each resilient folding beam 121 is relatively small, the time required for each resilient folding beam 121 to return to its original state has been shorten. The arrangement of multiple resilient beams 12 also makes the accelerometer be able to detect the slightest acceleration, and increases the accelerometer's measurement accuracy.

Figure 4:
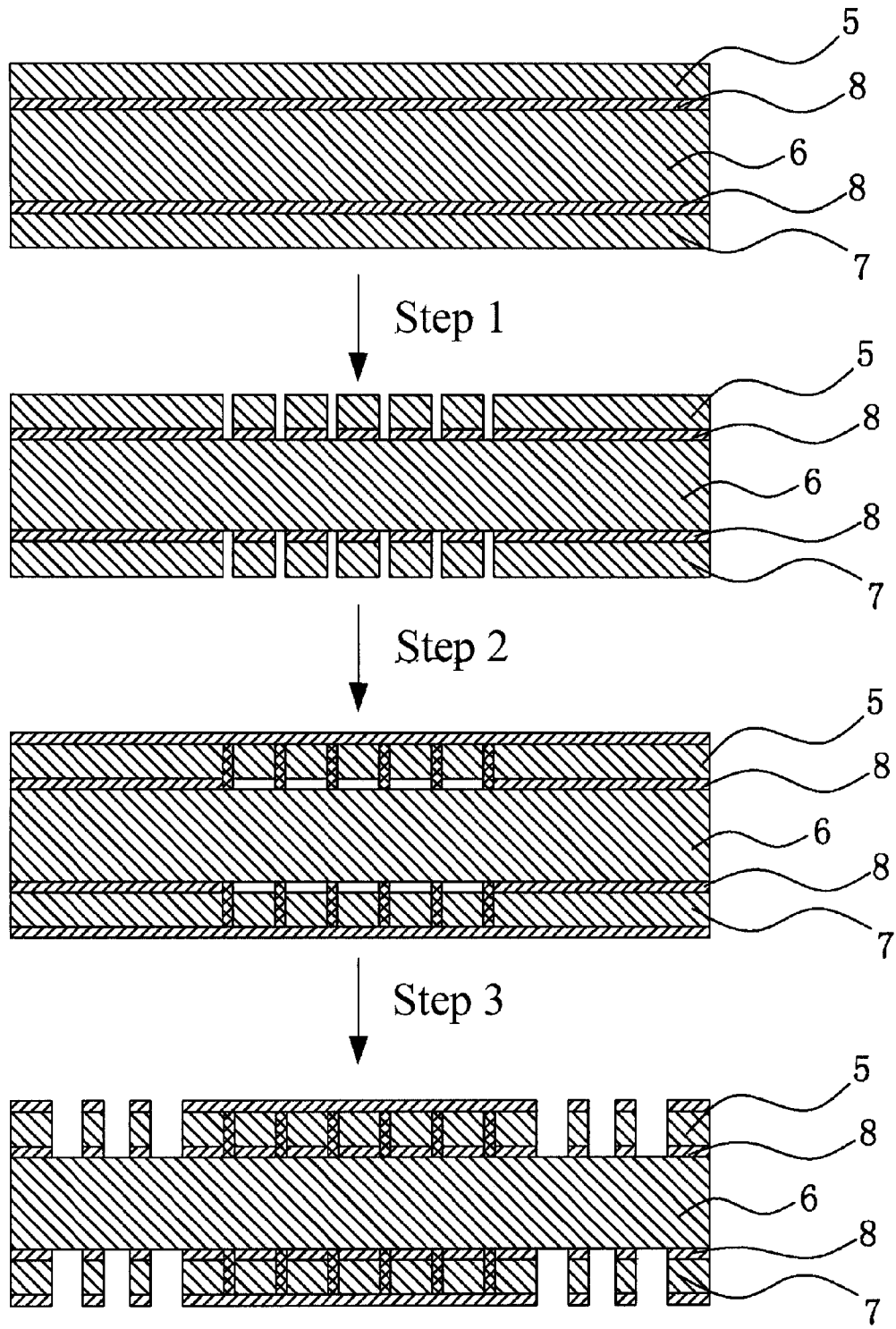
FIG. 4 is a diagram of step 1 to step 3 of the fabrication technique in accordance with the present invention.
Figure 5:
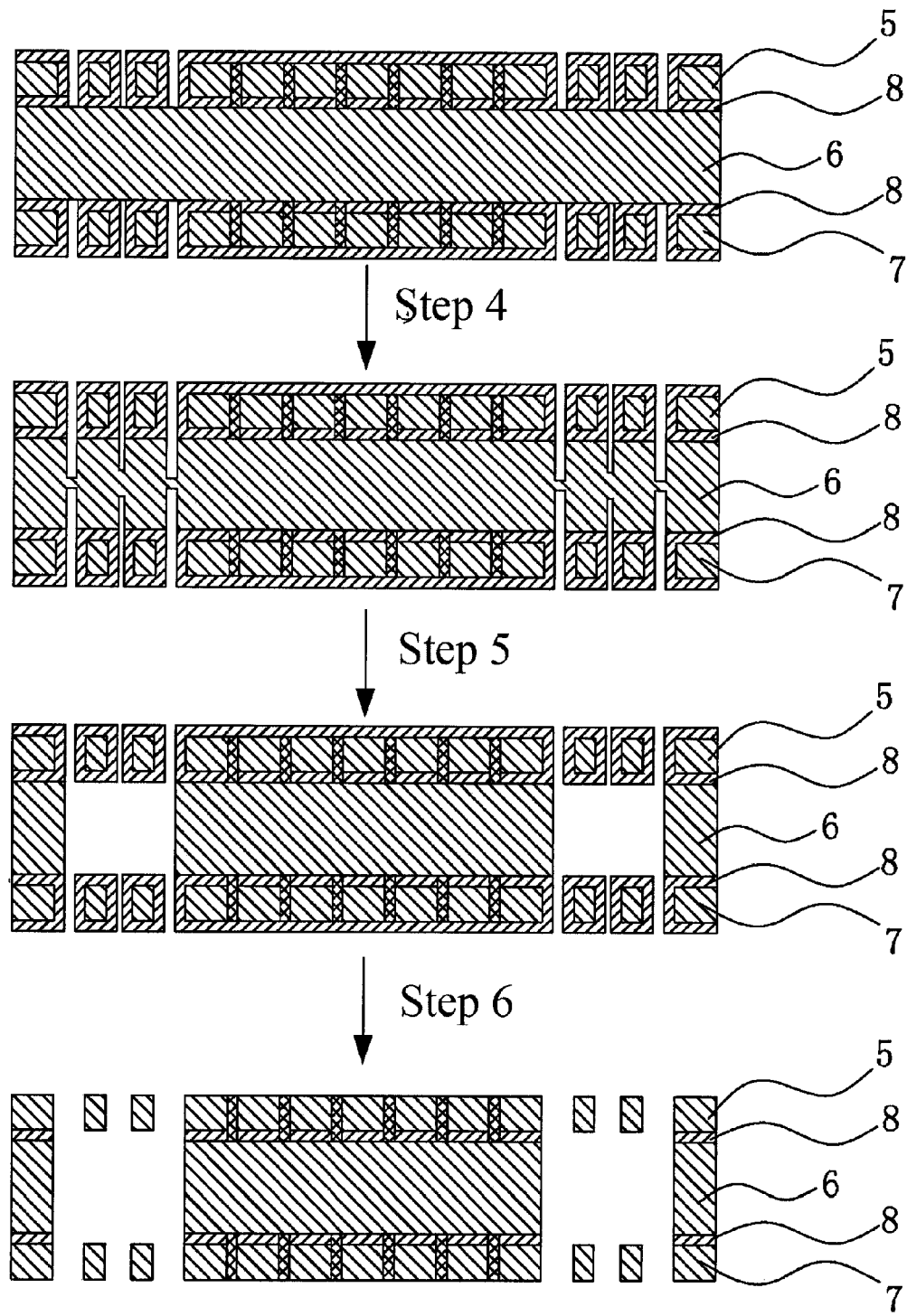
FIG. 5 is a diagram of step 4 to step 6 of the fabrication technique in accordance with the present invention.
Figure 6:
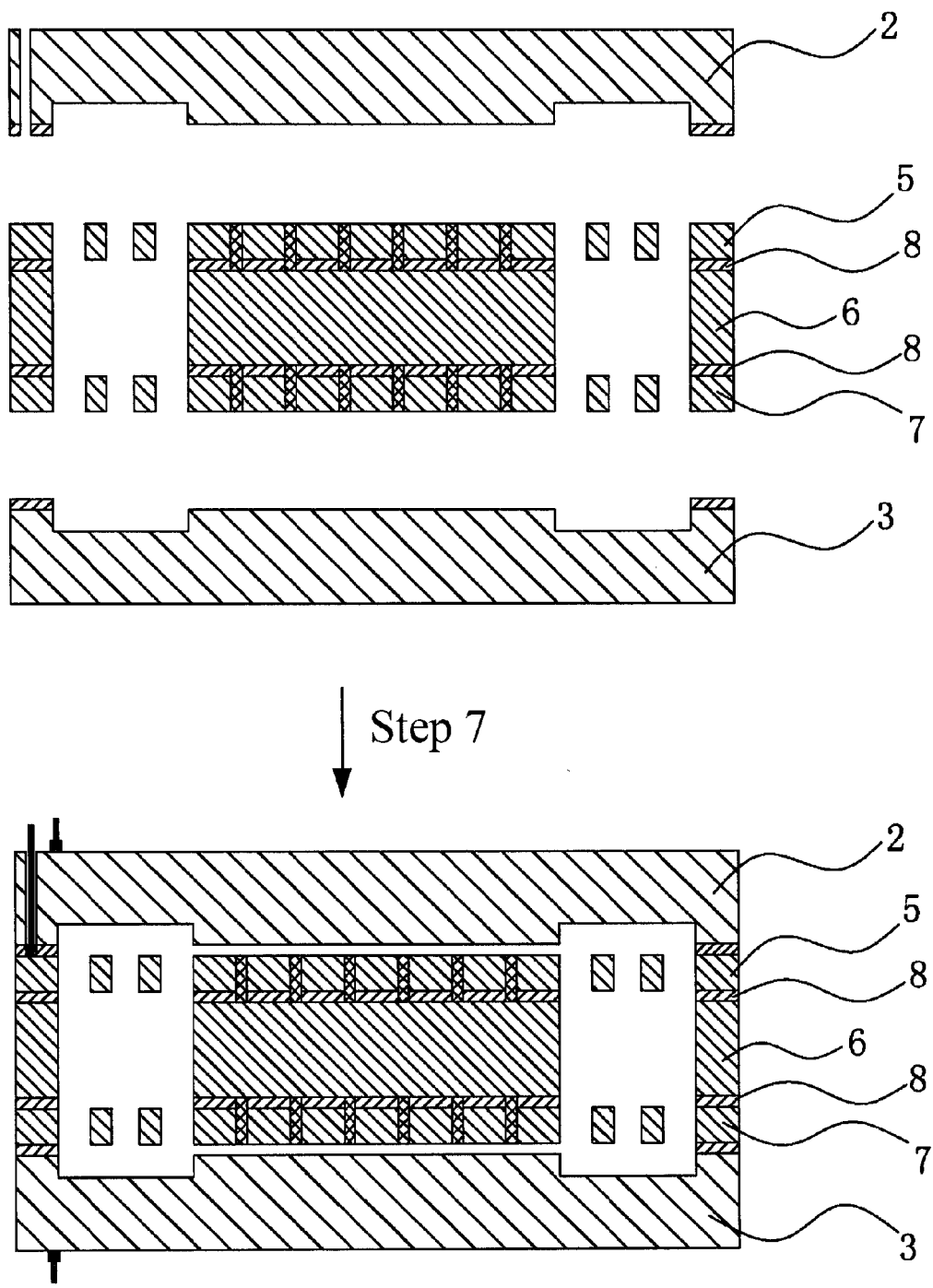
FIG. 6 is a diagram of step 7 of the fabrication technique in accordance with the present invention.

Next, the fabrication technique for the accelerometer disclosed in the present invention is described with reference to FIG. 4, FIG. 5, and FIG. 6, which includes the following steps:

Step 1, coat a layer of photoresist on the surface of the top silicon layer 5 and the bottom silicon layer 7 of the double side SOI silicon wafer. Then expose the top silicon layer 5 and the bottom silicon layer 7 according to certain patterns, and develop the patterns with developers to make the patterns apparent. After that, etch the exposed part of the top silicon layer 5 and the bottom silicon layer 7 to the silicon dioxide layer 8 by using the deep reactive ion etching. The exposed part of the silicon dioxide layer 8 is further etched using the dry reactive ion etching or buffered hydrofluoric acid, which form a plurality of holes, which are deep to the middle silicon layer 6. The photoresist is removed afterwards.

Step 2, deposit polycrystalline silicon to fill up the holes to form an electric circuit; grow a layer of silicon dioxide on the surfaces of the top silicon layer 5 and the bottom silicon layer 7. Then polish the surfaces of the top silicon layer 5 and the bottom silicon layer 7 by chemical or mechanical polishing technique in order to meet the smoothness requirement.

Step 3, coat a layer of photoresist on the surface of the top silicon layer 5 and the bottom silicon layer 7. Then expose the top silicon layer 5 and the bottom silicon layer 7 according to certain patterns, and develop the patterns developers to make the patterns apparent. First etch the exposed part of the grown silicon dioxide layer using dry reactive ion etching or buffered hydrofluoric acid. Then etch the top silicon layer 5 and the bottom silicon layer 7 to the silicon dioxide layer 8 using deep reactive ion etching. Finally etch the exposed part of the silicon dioxide layer using dry reactive ion etching or buffered hydrofluoric acid, to thereby form a plurality of resilient beams 12. A layer of silicon dioxide is either grown or chemical vapor deposited (CVD) on top of the resilient beams 12.

Step 4, etch to remove the exposed part of the silicon dioxide layer 8 by using dry etching method. Then deep etch the middle silicon layer 6 to a certain depth by using silicon deep reactive ion etching or gaseous xenon difluoride.

Step 5, etch the middle silicon layer 6, which has been etched to a certain depth, in both horizontal and vertical directions by using potassium hydroxide, or tetramethylammonium hydroxide, or ethylenediamine pyrocatechol, or gaseous xenon difluoride. The etching time is controlled based on the size of the region to be etched away in the middle silicon layer 6. After the middle silicon layer 6 is etched, two layers of free-moving resilient beams 12 and connection beams 122 are formed.

Step 6, etch to remove the silicon dioxide exposed on the silicon surface by using buffered hydrofluoric acid, 49% hydrofluoric acid, or gaseous hydrogen fluoride.

Step 7, Perform an one-step-bonding to the top cap silicon wafer, the processed double side SOI silicon wafer and the bottom cap silicon wafer.

The fabrication technique of the accelerometer disclosed in the present invention further includes the following steps:

The fabrication technique for the top cap silicon wafer and bottom cap silicon wafer also includes:

A. before bonding with the double side SOI silicon wafer, coat photoresist on the top cap silicon wafer 2 or the bottom cap silicon wafer 3; then expose according to certain patterns, and develop with developer to make the patterns apparent. Etch the exposed part of the top cap silicon wafer 2 or the bottom cap silicon wafer 3 until the silicon dioxide layer 8 is exposed by using deep reactive ion etching method, potassium hydroxide, tetramethyl ammonium hydroxide, or ethylenediamine phosphorus hydroquinone. Then further etch the exposed portion of the silicon dioxide layer 8 to form a through hole by using buffered hydrofluoric acid, 49% hydrofluoric acid, or gaseous hydrogen fluoride. The photoresist is removed in the end.

B, coat photoresist on the top cap silicon wafer 2 and the bottom cap silicon wafer 3; then expose according to certain patterns, and develop with developers to make the patterns apparent. Respectively etch the exposed parts of the top cap silicon wafer 2 and the bottom cap silicon wafer 3 to a certain depth by using deep reactive ion etching method, potassium hydroxide, tetramethylammonium hydroxide, or ethylenediamine pyrocatechol, to thereby respectively form a recess area on each of the bonding surfaces of top cap silicon wafer 2 and bottom cap silicon wafer 3.

C, clean the top cap silicon wafer 2 and the bottom cap silicon wafer 3 before bonding with the double side SOI silicon layer.

D, after boding with the double side SOI silicon wafer, deposit metal on the surfaces of the top cap silicon wafer 2 and bottom cap silicon wafer 3 to form electrodes 4; deposit metal on the surface of double side SOI silicon wafer through the through hole formed on either the top cap silicon wafer 3 or bottom cap silicon wafer 4 to form an electrode 4 through the through hole.

The silicon dioxide layers mentioned in the above fabrication technique serve the purpose of protecting the silicon layers, which are covered up by the silicon dioxide layers, from etching or corrosion.

The deep etching method and etching method mentioned in the present invention includes one or more of the following methods: dry etching or wet etching. The said dry etching includes, silicon deep reactive-ion etching and reactive-ion etching.

The material, equipment, and techniques used in the present invention have been disclosed by prior arts, but the accelerometer is dramatically improved by using these material and techniques, particularly by using the double side SOI silicon wafer. The resilient beams 12 and the mass 13, formed by etching the double side SOI silicon wafer, are accurately aligned and form a highly symmetrical structure. Compared with the prior art, which fabricates the two level beams by bonding, the accelerometer fabricated using the present technique has higher accuracy and small error; the throughput yield is also increased. Since the etching technique process is relatively simple, the present fabrication technique also has high production efficiency and low manufacturing cost. Furthermore, the geometry and vibration modes of the present accelerometer are symmetrical, which further increases the measurement accuracy.

The invention claimed is:

1. An accelerometer, comprising:
a measurement mass;
a top cap silicon wafer and a bottom cap silicon wafer, both coupled with the measurement mass;
wherein the measurement mass includes a support frame, a mass, and a plurality of resilient beams, the measurement mass has a double-sided silicon on insulator structure, which includes a top silicon layer, a middle silicon layer, and a bottom silicon layer, with a silicon dioxide layer provided between the top and middle silicon layers and between the bottom and middle silicon layers, the resilient beams are symmetrically formed in the top silicon layer and the bottom silicon layer to thereby form a double layer structure;
wherein the mass and the resilient beams are located within the support frame, characterized in that the mass and the support frame are connected by a plurality of sets of the resilient beams, wherein each set comprises two resilient folding beams provided symmetrically with respect to a midline of the mass; and
a plurality of connection beams, each connection beam coupling each set of the resilient folding beams together.

2. An accelerometer according to claim 1, wherein the connection beams are resilient connection beams.

3. An accelerometer according to claim 1, wherein each resilient folding beam has two ends located along the same line.

4. An accelerometer according to claim 1, wherein each resilient folding beam has one end connected to a corner of the mass.

5. An accelerometer according to claim 1, wherein a first electrode is coupled with the measurement mass, a second electrode is coupled with the top cap silicon wafer, and a third electrode is coupled with the bottom cap silicon wafer.

6. An accelerometer, comprising:
a measurement mass comprising:
a top silicon layer, a middle silicon layer, a bottom silicon layer, a first silicon dioxide layer between the top silicon layer and the middle silicon layer, and a second silicon dioxide layer between the middle layer and the bottom silicon layer;
a support frame;
a rectangular mass coupled to the support frame;
a first plurality of resilient beams symmetrically formed in the top silicon layer and coupled in pairs between respective sides of the mass and the support frame; and
a second plurality of resilient beams symmetrically formed in the bottom silicon layer and coupled in pairs between respective sides of the mass and the support frame; and
a plurality of connection beams, each connection beam coupling each pair of the resilient beams together;
a top cap silicon wafer coupled with the measurement mass; and
a bottom cap silicon wafer coupled with the measurement mass.

7. An accelerometer according to claim 6, wherein each resilient folding beam has two ends located along the same line.

8. An accelerometer according to claim 6, wherein each resilient folding beam has one end connected to a corner of the mass.

9. An accelerometer according to claim 6, wherein a first electrode is coupled with the measurement mass, a second electrode is coupled with the top cap silicon wafer, and a third electrode is coupled with the bottom cap silicon wafer.

10. An accelerometer according to claim 6, wherein each of the resilient beams is generally formed in a U-shape having a bottom portion and first and second side portions, wherein each pair of the resilient beams is disposed between respective sides of the mass and the support frame such that the bottom portions of the resilient beam pair are located proximate to each other and the side portions of the resilient beam pair extend away from each other, the bottom portions are coupled by a single connection beam, the first side portion of each resilient beam is coupled to the mass and the second side portion of each resilient beam is coupled to the support frame.

* * * * *